United States Patent [19]

Honda et al.

[11] Patent Number: 4,797,626
[45] Date of Patent: Jan. 10, 1989

[54] OFFSET VOLTAGE CORRECTION CIRCUIT FOR GRIDDED POWER TUBES

[75] Inventors: Hiroshi Honda, Garden Grove, Calif.; Eduardo D. Szyszlican, Lanus O., Argentina

[73] Assignee: Hughes Aircraft Company, Los Angeles, Calif.

[21] Appl. No.: 902,270

[22] Filed: Aug. 29, 1986

[51] Int. Cl.[4] .................... H03K 3/02; H01J 19/82
[52] U.S. Cl. .................... 328/225; 307/264; 307/491; 328/227; 328/198
[58] Field of Search ............ 307/491, 264; 328/225, 328/227, 232, 233, 173, 198; 358/34, 171, 172

[56] References Cited

U.S. PATENT DOCUMENTS 3,463,940  8/1969  Kaye et al. ............... 307/264
4,093,876  6/1978  Henein et al. ............ 307/264
4,564,863  1/1986  Chamerdy et al. ........ 307/264

OTHER PUBLICATIONS

Preliminary Design Report #3, Oct. 1983 through Dec. 1983, Usaeradcom Contract DAAK20-83-0130. Unpublished report, copy attached.

Primary Examiner—John Zazworsky
Attorney, Agent, or Firm—A. W. Karambelas

[57] ABSTRACT

An offset voltage correction circuit for a gridded power tube, such as a gridded traveling wave tube (GTWT), provides from a pulsed, floating, negatively offset voltage signal representing the pulsed current output of the tube, a corrected pulsed, zero voltage offset signal. Such corrected signal is used in a feedback loop to control the voltage signal provided to the tube grid in a manner causing the pulsed output current of the tube to have a preestablished amplitude. The signal correcting circuit includes a $\pi$-shaped network formed of a capacitor and first and second transistors. The two transistors are connected in electrical parallel so that between pulses of the offset voltage signal the first one of the transistors is held off and keeps the second transistor turned on so that the capacitor charges to the negative offset voltage of the offset voltage signal. During the pulsess of the offset voltage signal, the first transistor is turned on and thereby turns the second transistor off, causing the capacitor output side to provide a zero offset voltage pulse having an amplitude equal to the sum of the negative offset and positive voltages (the total peak-to-peak voltage) of the voltage offset signal. The zero offset signal is used by a control loop circuit and a grid pulse modulator to provide a control voltage signal to the grid of the tube which maintains the pulsed output current of the tube at a preselected level in spite of tube aging and thermal effects which tend to cause the output current to change.

10 Claims, 2 Drawing Sheets

OFFSET VOLTAGE CORRECTION CIRCUIT FOR GRIDDED POWER TUBES

This invention was made with the Government support under contract number DAAK20-83-C0130 awarded by the Department of the Army.

1. Field of the Invention

The present invention relates generally to the field of electronic, gridded power tubes, such as gridded traveling wave tubes, and more particularly to electronic apparatus for automatically regulating the grid voltage of such tubes so as to provide a constant (or preselected) pulsed current output.

2. Background Discussion

Gridded traveling wave tube (GTWT) amplifiers are widely considered to constitute one of the key radar developments of the 1960's, such GTWT amplifiers having made possible truly versatle, multimode airborne radars. For the first time, by use of GTWT's, it became possible to precisely control both the width and pulse repetition frequency (PRF) of a radar's high power transmitted pulses and to readily change the pulse width and PRF of the radar, almost instantaneously, to virtually any values within the power handling capability of the tube. These important new capabilities providing by control gridding are in addition to the basic capabilities of traveling wave tubes (TWT's), which include a high degree of coherence required for Doppler operation, precise control of radio frequency and the ability to conveniently code the pulse's radio frequency or phase for pulse compression.

Although a pulsed output of a TWT can be attained by rapidly turning the tube "on" and "off", the output pulses are more conveniently and efficiently formed in gridded TWT's by the interposing of a control grid between the tube cathode, which emits the electrons, and the anode where a positive voltage, relative to the cathode, accelerates the electrons. In operation, GTWT's build up the power of an input signal, received from an exciter circuit of the radar, to the desired transmitting level. Pulsed operation is provided by low voltage pulses, from a grid oulse modulator, which turn the GTWT "on" and "off" by actuation of the control grid. Changing the width and repetition frequency of the voltage pulses to the GTWT grid respectively varies the width and repetition frequency of the high power, output pulses provided by the GTWT. These output pulses of a GTWT can readily be coded for pulse compression by modulating the frequency or phase of the low power grid input signals.

Typically, GTWT's are intended to be operated so as to provide a predetermined, constant output pulsed current level and are, therefore, provided with a constant voltage level grid control signal. However, as might perhaps be expected, the power output of GTWT's, at a constant voltage grid signal, diminishes as the tube ages and may also change due to temporary or permanent thermal distortion of the heater-cathode-grid structure. In the case of tube aging and in most cases of thermal distortion, the power output of a GTWT diminishes for a constant grid signal and performance of the associated radar is correspondingly degraded.

Because of such power output variation with tube age and thermal distortion, some means are usually provided for measuring the GTWT power output and for enabling the grid voltage signal level to be adjusted in a manner maintaining the power output within a predetermined range or at a preestablished level. Commonly, the pulsed power output current of GTWT s is determined by conventional current transformers which measure output current with only minimal effect on the measured current. The measured output current signal is typically converted to a corresponding voltage signal which is displayed on a CRT or meter. The level of the grid voltage signal is manually adjusted, as may be necessary, to return the GTWT output current, as indicated by the voltage displayed on the CRT or meter, to its required level.

Most commonly, such manual adjustments of the GTWT grid voltage signal level are made at scheduled operating intervals, for example, at scheduled maintenance periods, by trained technicians. Accordingly, a principal disadvantage associated with such manual grid voltage level adjustments, to compensate for GTWT aging and thermal distortion effects, is that the periodic attention of a trained technician is needed to maintain the GTWT output within required limits. However, particularly in typical military field conditions, trained electronic technicians may not be available to make such adjustments. Moreover, even trained technicians, especially under adverse or stressful combat conditions, may make mistakes which could cause serious equipment damage. For example, if the GTWT grid voltage level is accidentally set too high, the resulting excessively high output circuit may damage the GTWT or may damage downstream electronic modules.

Still another disadvantage of making only periodic, manual grid voltage level adjustment is that between adjustments degraded GTWT output current may adversely affect operation of the associated electronic equipment. The range of an associated radar may, as an illustration, be significantly reduced.

One result of such problems is that at least for many military procurement programs, a requirment or objective is that the amount of technician effort required to maintain and support electronic equipment be reduced. This is particularly the case for complex military electronics equipment for which the providing of trained operators and technicians is a constant problem.

It can therefore, be appreciated that automatic electronic GTWT voltage level adjustment to maintain proper GTWT operation is, if not required, at least highly desirable. However, in keeping with increased efforts to improve cost effectiveness of equipment, such automatic grid voltage adjustment needs not only to be operationally effective but also to be of relatively low cost.

As mentioned above, GTWT output current is typically, and most effectively, detected by conventional current transformers. The voltage pulse signal provided by the current transformers, however, ordinarily "floats" with respect to a zero voltage reference. As a result, the voltage pulses provided generally have a negative voltage offset portion as well as a positive voltage portion, the peak-to-peak pulse voltage, of course, heing the sum of the negative offset voltage portion and the positive voltage portion. Depending upon such factors as the duty cycle and pulse repetition frequency of the GTWT, the negative voltage offset portion of the voltage signal can vary between about zero percent and about 50 percent of the signal peak-to-peak voltage. When these offset voltage signals are displayed on a CRT to enable manual adjustment of the grid voltage level, the negative offset voltage can usually be accommodated by shifting the CRT reference voltage zero to the most negative level of the signal. Thereafter, the signal can be treated as having a peak positive voltage equal to the signal peak-to-peak voltage, as is necessary for evaluating the GTWT pulsed output current and adjusting the grid signal voltages.

However, when an automated feedback circuit is provided for adjusting the grid voltage signal level in response to changes in the GTWT output current transformer voltage signal, the floatihg transformer voltage is much more difficult to work with. For example, only the positive voltage portion of the signal is ordinarily considered. This positive voltage portion may however, as described above, fluctuate substantially with GTWT duty cycle and PRF, it thereby appearing to an electronic feedback circuit that the GTWT output current is fluctuating when, in fact, the transformer signal peak-to-peak voltage may be relatively constant, thereby indicating that the GTWT output current is steady. Thus, when the positive voltage portion of the transformer signal varies due to offset shifting, rather than due to peak-to-peak variation, automatic feedback circuits provide inaccurate control and may cause the grid signal voltage to change in a manner causing, instead of eliminating, output current variations.

Since floating voltage signals from the current transformer can cause grid voltage feedback circuit problems, it is necessary to eliminate, in some manner, the negative voltage offset in the transformer voltage signal. However, to be practical, the means used to eliminate the offset must be effective without affecting the peak-to-peak voltage and must, at the same time, be economical to produce and reliable in operation.

Towards this end, it appears in theory that the installation of a diode in electrical series between the current sensing transformer and a circuit controlling the grid signal voltage level should be capable of shifting the output signal so as to eliminate any negative voltage offset without substantially affecting the peak-to-peak voltage. In practice, however, the present inventors have determined that the distributed resistance along the transformer windings varies the "core reset" time constant to such an extent that diodes in the transformer line are ineffective in eliminating the negative offset.

For these and other reasons, satisfactory, economical means for eliminating, for gridded tubes, the voltage offset in output transformer voltage signals without affecting the peak-to-peak voltage of such signals, are still necessary to enable automated grid voltage signal control for GTWT's and other gridded power tubes.

SUMMARY OF THE INVENTION

According to the present invention, a electronic voltage offset correcting circuit, for a gridded power tube having a pulsed output current, comprises means responsive to the pulsed output current of the tube for providing a pulsed, offset voltage signal proportional thereto. The offset voltage signal provided is offset from a zero voltage reference by between about zero percent and about 50 percent of the peak-to-peak voltage of the offset voltage signal, the percentage of the voltage offset being different for different operating conditions of the power tube. Included in the correcting circuit are voltage offset correcting means for receiving the offset voltage signal and responsive thereto for providing a pulsed, corrected voltage signal having substantially no voltage offset, and preferably having a peak-to-peak voltage which is equal to the peak-to-peak voltage of the pulsed offset voltage signal being corrected. Preferably the corrected voltage signal is substantially identical to the offset voltage signal except that the corrected signal has no voltage offset. Further included are means for receiving the corrected voltage signal and responsive thereto for providing to the tube grid a pulsed grid voltage which causes the pulsed output current of the tube to conform to a predetermined value.

According to a preferred embodiment of the invention, the voltage offset correcting means have an input at which the pulsed offset voltage signal is received and an output at which the pulsed, corrected voltage signal is provided. Included are a capacitor connected between the input and the output, and means for causing the capacitor to charge to a negative offset voltage of the pulsed offset voltage signal between pulses thereof and, during the voltage offset voltage signal, pulses, for adding the voltage to which the capacitor is charged to a non-offset voltage of the offset voltage signal, the sum of the offset voltage and the non-offset voltage of the voltage offset signal being equal to the peak-topeak voltage thereof. Preferably, the means for causing the capacitor to include a first transistor which is in the off-state between pulses of the pulsed offset voltage signal and a second transistor which is in the on-state between such pulses, the first and second transistors being connected in electrical parallel. The first transistor is a bipolar transistor and the second transistor is a field effect transistor, the collector of the bipolar transistor being connected to the gate of the field effect transistor.

BRIEF DESCRIPTION OF THE DRAWING

A better understanding of the present invention may be had from a consideration of the accompanying drawing in which.

DESCRIPTION OF THE PREFERRED EMBODIMENT

Figure 1:
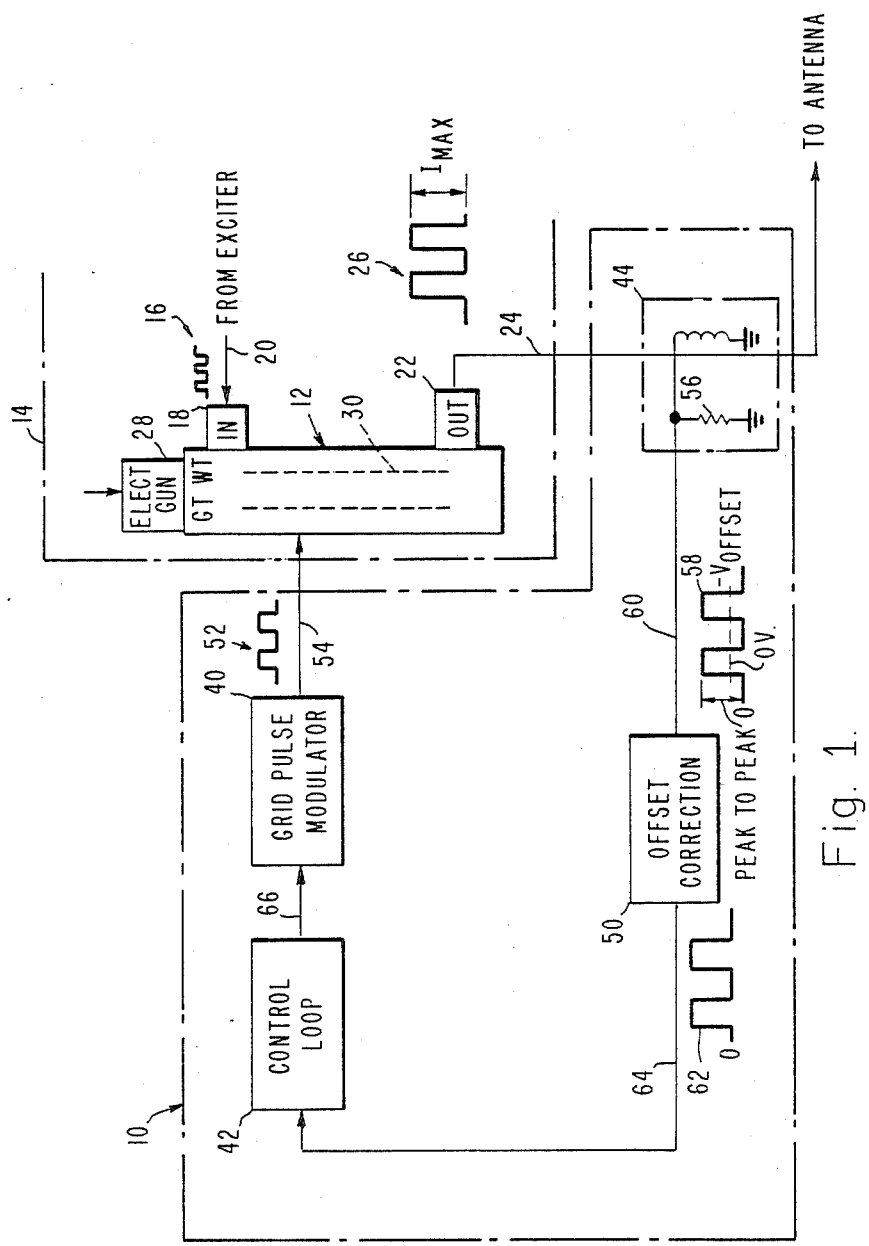
FIG. 1 is a functional block diagram showing electronic grid voltage control portions of a system, such as a radar system, which uses a gridded traveling wave tube (GTWT)

There is depicted in FIG. 1, in functional block diagram form, a grid control circuit 10 having offset voltage correction provisions. As depicted, circuit 10 is connected for providing a grid control voltage signal to an associated gridded power tube 12. Such power tube 12 may, for example and without limitation, be a gridded traveling wave tube (GTWT) which comprises a part of an associated radar transmitter 14. Power tube 12 may alternatively be a Klystron tube or any other type of gridded power tube, the present invention not being limited to use with GTWT's. However, solely for purposes of describing the present invention a GTWT is assumed.

Typically, power tube 12 may, as shown in FIG. 1, be connected to an electronic exciter circuit (not shown), for receiving a low power microwave signal 16 therefrom into an "IN" port 18 via an electrical conductor 20. Tube 12 is further connected for providing, from an "OUT" port 22 and over a conduit 24, a pulsed output current signal 26, such signal being provided, for example, to an antenna (not shown) which forms part of an associated radar system (also not shown). Tube 12 typically further comprises an electron gun 28 and a control grid 30. Operation of tube 12 is known in the art and will not, therefore, be described herein except to the extent necessary to explain the present invention.

Comprising control circuit 10 are a grid pulse modulator 40, a control loop 42, a current transformer 44 and an offset correcting circuit means 50 according to the present invention. Grid pulse modulator 40, preferably of a known configuration, provides a grid voltage signal 52, over an electrical conduit 54, to grid 30 of tube 12. Current transformer 44 is operatively associated with GTWT output conduit 24 so that, by induction, GTWT output current signal 26 provides, across a resistor 56, a pulsed, voltage signal 58 having a variable, negative voltage offset. Signal 58 is received by offset correction means 50 over a conduit 60. As more particularly described below, offset correcting means 50 provide, in response to offset voltage signal 58, a corresponding, corrected voltage signal 62 which has the same peak-to-peak voltage as the offset voltage signal, but with zero negative voltage offset. Such corrected voltage signal 62 is provided over a conduit 64, to an input of control loop circuit 42.

Preferably, but not necessarily, control loop circuit 42 is configured as described in copending U.S. patent application Ser. No. 06/740,109, filed May 31, 1985, and which is incorporated herein in its entirety by specific reference. A conduit 66 connects the output of control loop circuit 42 to an input of grid pulse modulator 40.

Figure 2:
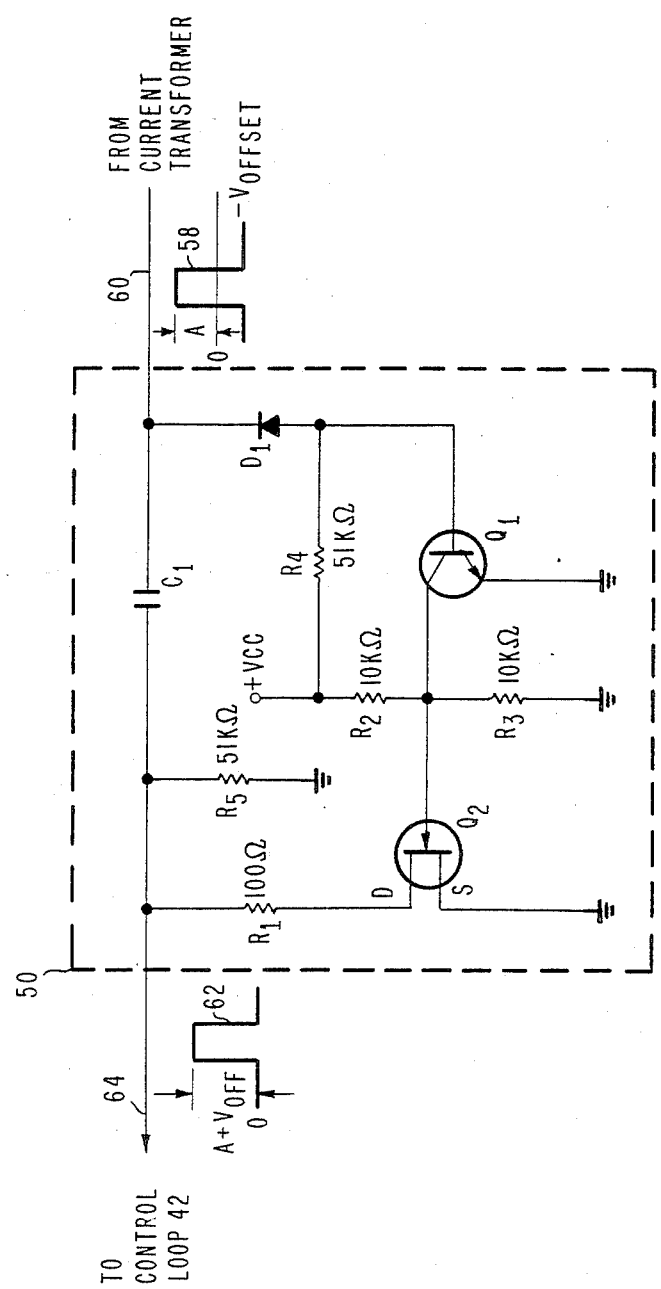
FIG. 2 is a circuit schematic drawing of an offset voltage correction circuit associated with the grid control portion of FIG. 1 showing configuration of the correction circuit.

Described more particularly, offset correction means 50, as shown schematically in FIG. 2, principally comprise a π-shaped arrangement of a capacitor $C_1$ and first and second transistors $Q_1$ and $Q_2$, the latter comprising the "legs" of the electrical structure. As shown in FIG. 2, transistor $Q_1$ may advantageously be a conventional NPN, bipolar transistor which may, for example, be a currently available type 2N2309A. Transistor $Q_2$ may, on the other hand, be a field effect transistor, for example, a type 112094-8. The base connection of transistor $Q_1$ is connected, through a diode, $D_1$, to the input side of capacitor $C_1$ which receives offset voltage signal 58 on conduit 60. The drain connection of transistor $Q_2$ is connected, through a resistor $R_1$, to the output side of capacitor $C_1$ which provides corrected (non-offset) voltage signal 62 on conduit 64. The source connection of transistor $Q_2$ is grounded as is the emitter connection of transistor $Q_1$. The collector of transistor $Q_1$ is connected to the gate of transistor $Q_2$ and is grounded through a resistor $R_3$. Operating voltage (+VCC) is provided to the collector of transistor $Q_1$ and the gate of transistor $Q_2$ through a resistor $R_2$. Connected between +VCC and the base of transistor $Q_1$ is a resistor $R_4$. The output side of capacitor $C_1$ is connected to ground through a resistor $R_5$.

By way of example, for a peak-to-peak voltage of about 1.7V for offset voltage signal 58 for an average duty cycle of about 5 percent and for a pulse width of about 10 micro seconds, capacitor $C_1$ and resistors $R_1$-$R_5$ may advantageously have the values shown below in Table 1.

TABLE 1

| Element | Value |
|---------|-------|
| $C_1$ | 47 pf |
| $R_1$ | 100 Ω |

TABLE 1-continued

| Element | Value |
|---------|-------|
| $R_2$ | 10K Ω |
| $R_3$ | 10K Ω |
| $R_4$ | 51K Ω |
| $R_5$ | 51K Ω |

OPERATION OF CORRECTING MEANS 50

Between pulses of offset voltage signal 58, transistor $Q_1$ is maintained in an off condition by signal 58. As a result, during interpulse periods, the gate of transistor $Q_2$ has positive voltage applied thereto from +VCC across the $R_2$ and $R_3$ voltage dividing network, thereby maintaining the output side of capacitor $C_1$ at zero volts (low impedance through $R_1$ and turned-on transistor $Q_2$). This condition forces the negative offset voltage (−V offset) to charge capacitor C1 to such offset voltage.

During each pulse of offset voltage signal 58, transistor $Q_1$ is turned on, thereby reducing the gate voltage of transistor $Q_2$ to ground and turning off transistor $Q_2$. Such turning off of transistor $Q_2$ causes the output side of capacitor C1 to have a high impedance (through resistor $R_5$) to ground. As a result, output conduit 64 is provided, by capacitor $C_1$, an output voltage equal to the sum of the above-ground voltage amplitude, A, of offset voltage signal 58 and the negative voltage offset, V offset, with a zero voltage base or reference line. Thus, the output, corrected voltage signal 62 always has an above-zero voltage amplitude equal to the peak-to-peak voltage (A+$V_{offset}$) of offset voltage signal 58, irrespective of any baseline shifts in the offset voltage signal.

The above-described correction of offset voltage signal 58 by means 50, to provide zero offset, corrected signal 62, requires only a few electronic components. Means 50 are, therefore, comparatively inexpensive and have the capability for highly reliable operation. In addition, signal correcting means 50 is small and light weight and, because of its relative few components, is adaptable for integration by known microelectronic fabrication techniques.

Although there has been described above a particular arrangement of an electronic circuit or apparatus for correcting offset voltage signals, and thereby for enabling automatic control of grid voltage signals provided to such gridded power tubes as GTWT's, for purposes of illustrating the manner in which the invention may be used to advantages, it is to be appreciated that the invention is not limited thereto. Accordingly, any and all variations and modifcations which may occur to those skilled in the art are to be considered as being within the scope and spirit of the claims appended hereto.

What is claimed is:

1. An electronic, voltage-offset correcting circuit for a gridded power tube having a pulsed output current, the correcting circuit comprising:
    (a) means responsive to the pulsed output current of the power tube for providing a pulsed, offset voltage signal proportional to said output current said offset voltage signal being offset from a zero voltage reference by between about zero percent and about 50 percent of the peak-to-peak voltage of the offset voltage signal, the percentage of the voltage offset varying according to operating conditions of the power tube;

(b) voltage offset correcting means for receiving the offset voltage signal and responsive thereto for providing a pulsed, corrected voltage signal having substantially no voltage offset from said zero reference; and (c) means for receiving the corrected voltage signal and responsive thereto for providing to the tube grid a pulsed grid voltage which causes the pulsed output current of the tube to have a predetetmined value.

2. The voltage offset correcting circuit as claimed in claim 1 wherein the pulsed, corrected voltage signal has a peak-to-peak voltage equal to the peak-to-peak voltage of the pulsed offset voltage signal being corrected.

3. The voltage offset correcting circuit as claimed in claim 1 wherein the voltage offset correcting means have an input at which the pulsed offset voltage signal is received and an output at which the pulsed, corrected voltage signal is provided and include a capacitor connected between the input and the output and means for causing the capacitor to charge to a negative offset voltage of the pulsed offset voltage signal between pulses thereof and, during the receiving of the voltage offset voltage signal pulses, for adding the voltage to which the capacitor is charged to the positive voltage portion of the offset voltage signal, the sum of the negative offset voltage and the positive voltage portion of the voltage offset signal being equal to the peak-to-peak voltage thereof.

4. The voltage offset correcting circuit as claimed in claim 3 wherein the means for causing the capacitor to charge include a first transistor which is in the off-state between pulses of the pulsed offset voltage signal and a second transistor which is in the on-state between said pulses, said first and second transistors being connected to electrically opposite terminals of said capacitor.

5. The voltage offset correcting circuit as claimed in claim 4 wherein the first transistor is a bipolar transistor and the second transistor is a field effect transistor and wherein the collector of the bipolar transistor is connected to the gate of the field effect transistor.

6. The voltage offset correcting circuit as claimed in claim 1 wherein the magnitude of the pulsed corrected voltage signal is substantially identical to that of the pulsed offset voltage signal except the corrected voltage signal has substantially no voltage offset from the zero voltage reference.

7. An electronic, voltage-offset correcting circuit for a gridded power tube, such as a gridded traveling wave tube or the like, having a pulsed output current, the voltage-offset correcting circuit comprising:

(a) a transformer circuit responsive to the pulsed output current of the power tube for providing a pulsed, offset voltage signal proportional to said output current, said offset voltage signal having an offset portion which is offset from a zero voltage reference by between about zero percent and about 50 percent of the peak-to-peak voltage of the offset voltage signal, the percentage of the voltage offset being different for different operating conditions of the power tube;

(b) voltage offset correcting means connected for receiving the pulsed offset voltage signal and being responsive thereto for providing a corrected, pulsed voltage signal which is substantially identical to the pulsed offset voltage signal except that the corrected signal has substantially zero offset voltage irrespective of the amount of voltage offset of the offset voltage signal; and (c) means responsive to the orrected, pulsed voltage signal for providing a pulsed control voltage signal to the grid of the power tube which causes the pulsed current output of the tube to have a preestablished current output.

8. The voltage offset correcting circuit as claimed in claim 7 wherein the correcting means comprise an electronic network having a capacitor and a first and second transistor connected to opposite terminals of said capacitor to apply a charging current thereto between pulses of the offset voltage signal to charge said capacitor to the level of the offset voltage portion of the offset voltage signal, and to add the capacitor voltage to a non-offset voltage portion of the voltage offset signal during said pulses to provide a corrected, non-offset voltage signal having a peak-to-peak voltage equal to the peak-to-peak voltage of the voltage offset signal.

9. A voltage offset correcting circuit for a gridded power tube system having a grid pulse modulator for providing a pulsed voltage to the grid of the power tube to cause the power tube to provide a pulsed current output and having transformer means for sensing said pulsed current output and for providing, in response thereto, a corresponding pulses offset voltage signal offset from a zero voltage reference by between about zero percent and about 50 percent of the peak-to-peak voltage of the offset voltage, the amount of the voltage offset being different for different operating conditions of the power tube, the correcting circuit comprising:

(a) an electronic network including a capacitor and first and second transistors connected to opposite terminals of said capacitor to apply a charging current thereto between pulses of the offset voltage signal to charge said capacitor to a voltage equal to the amount of the offset voltage and to add the capacitor voltage to a non-offset voltage portion of the offset voltage signal during said pulses to provide a corrected, pulsed voltage signal having a peak-to-peak voltage equal to the peak-to-peak voltage of the offset voltage signal; and (b) means connected for receiving the corrected, pulses voltage signal and responsive thereto for controlling the grid pulse modulator so that the grid voltage signals provided thereby to the tube grid cause the tube output current pulses to have a peak current equal to a preselected peak current.

10. The current as claimed in claim 9 wherein said capacitor and first and second transistors are connected in a network with said transistors being connected electrically in parallel and forming the legs of said arrangement, said transistors being further connected so that when said first transistor is turned off, said second transistor is turned on and said capacitor is charged to the offset voltage of the offset voltage signal and when said first transistor is turned on, said second transistor is turned off and an output side of said capacitor provides a corrected voltage signal having a zero voltage offset and having a peak-to-peak voltage equal to the peak-to-peak voltage of the voltage offset signal.

* * * * *